US012578374B2

(12) United States Patent
Mutha et al.

(10) Patent No.: US 12,578,374 B2
(45) Date of Patent: Mar. 17, 2026

(54) MULTI-ENDED IMPEDANCE-BASED FAULT LOCATING FOR UNTRANSPOSED TRANSMISSION LINES

(71) Applicant: Schweitzer Engineering Laboratories, Inc., Pullman, WA (US)

(72) Inventors: Sathish Kumar Mutha, Moscow, ID (US); Arun Shrestha, Charlotte, NC (US); Sajal Harmukh, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 80 days.

(21) Appl. No.: 18/817,515

(22) Filed: Aug. 28, 2024

(65) Prior Publication Data

US 2026/0063699 A1      Mar. 5, 2026

(51) Int. Cl.
H02H 7/00 (2006.01)
G01R 31/08 (2020.01)
H02H 7/22 (2006.01)

(52) U.S. Cl.
CPC ......... G01R 31/086 (2013.01); G01R 31/088 (2013.01); H02H 7/22 (2013.01)

(58) Field of Classification Search
None
See application file for complete search history.

(56) References Cited

U.S. PATENT DOCUMENTS

| | | |
|---|---|---|
| 4,107,778 A | 8/1978 | Nii |
| 4,161,011 A | 7/1979 | Wilkinson |
| 4,367,507 A | 1/1983 | Shperling |
| 4,405,966 A | 9/1983 | Cavero |
| 4,825,327 A | 4/1989 | Alexander |
| 5,140,492 A | 8/1992 | Schweitzer |
| 5,703,745 A | 12/1997 | Roberts |

(Continued)

OTHER PUBLICATIONS

Edmund O. Schweitzer, III, Evaluation and Development of Transmission Line Fault Locating Techniques Which Use Sinusoidal Steady-State Information, 9th Annual Western Protective Relay Conference, Oct. 26-28, 1982.

(Continued)

*Primary Examiner* — Stephen W Jackson
(74) *Attorney, Agent, or Firm* — Fletcher Yoder, P.C.; Richard M. Edge

(57) ABSTRACT

A method to determine a location of a fault in a power network includes monitoring electrical measurements, receiving an indication of a presence of the fault; determining a first sequence mutual coupling parameter based on the electrical measurements, wherein the first sequence mutual coupling parameter indicates a mutual coupling of a positive sequence to a negative sequence of the power network, determining a second sequence mutual coupling parameter based on the electrical measurements, wherein the second sequence mutual coupling parameter indicates a mutual coupling of a zero sequence to the negative sequence of the power network, determining the location of the fault based on the indication of the presence of the fault, the first sequence mutual coupling parameter, and the second sequence mutual coupling parameter, and sending one or more commands to one or more devices to adjust one or more operations based on the location of the fault.

20 Claims, 10 Drawing Sheets

(56) References Cited

U.S. PATENT DOCUMENTS

| | | | |
|---|---|---|---|
| 6,028,754 | A | 2/2000 | Guzman-Casillas |
| 6,496,342 | B1 * | 12/2002 | Horvath ............ H02J 13/00002 |
| | | | 361/64 |
| 6,721,671 | B2 | 4/2004 | Roberts |
| 7,660,088 | B2 | 2/2010 | Mooney |
| 8,410,785 | B2 | 4/2013 | Calero |
| 8,525,522 | B2 | 9/2013 | Gong |
| 8,558,551 | B2 | 10/2013 | Mynam |
| 8,736,297 | B2 | 5/2014 | Yelgin |
| 8,942,954 | B2 | 1/2015 | Gong |
| 9,257,827 | B2 | 2/2016 | Calero |
| 10,162,015 | B2 | 12/2018 | Xu |
| 10,197,614 | B2 | 2/2019 | Benmouyal |
| 10,261,567 | B2 | 4/2019 | Mynam |
| 10,436,831 | B2 * | 10/2019 | Kang ................... G01R 31/085 |
| 10,581,237 | B2 * | 3/2020 | Schweitzer, III ...... H02H 7/265 |
| 10,649,020 | B2 | 5/2020 | Achanta |
| 11,169,195 | B2 | 11/2021 | Naidu |
| 11,346,878 | B2 | 5/2022 | Benmouyal |
| 11,650,241 | B1 * | 5/2023 | Juvekar ................ G01R 31/088 |
| | | | 324/522 |
| 12,385,962 | B2 | 8/2025 | Shrestha |
| 2004/0032265 | A1 | 2/2004 | Turner |
| 2004/0167729 | A1 | 8/2004 | Saha |
| 2009/0150099 | A1 | 6/2009 | Balcerek |
| 2011/0264389 | A1 | 10/2011 | Mynam |
| 2012/0004867 | A1 | 1/2012 | Mousavi |
| 2014/0117912 | A1 * | 5/2014 | Gajic ....................... H02H 7/06 |
| | | | 318/490 |
| 2014/0236502 | A1 | 8/2014 | Calero |
| 2014/0351472 | A1 | 11/2014 | Jebson |
| 2016/0077150 | A1 | 3/2016 | Schweitzer, III |
| 2017/0003335 | A1 | 1/2017 | Kang |
| 2017/0227611 | A1 | 8/2017 | Xu |
| 2019/0296543 | A1 | 9/2019 | Liu |
| 2019/0317143 | A1 | 10/2019 | Dase |
| 2021/0063460 | A1 | 3/2021 | Dase |

OTHER PUBLICATIONS

Yanfeng Gong, Mangapathirao Mynam, Armando Guzman, Gabriel Benmouyal, Boris Shulim, Automated Fault Location System for Nonhomogeneous Transmission Networks, 37th Annual Western Protective Relay Conference, Oct. 19-21, 2010.

Gabriel Benmouyal, Jeff Roberts, Superimposed Quantities: Their True Nature and Application in Relays, 26th Annual Western Protective Relay Conference, Oct. 26-28, 1999.

Fernando Calero, Daqing Hou, Practical Single-Pole Line Protection Scheme Considerations, 31st Annual Western Protective Relay Conference, Oct. 19-21, 2004.

Gabriel Benmouyal, Armando Guzman, Rob Jain, Tutorial on the Impact of Network Parameters on Distance Element Resistance Coverage, 40th Annual Western Protective Relay Conference Oct. 15-17, 2013.

E.O. Schweitzer, III, Armando Guzman, Mangapathirao Mynam, Veselin Skendic, Bogdan Kasztenny, Stephen Marx, Locating Faults by the Traveling Waves They Launch, 40th Annual Western Protective Relay Conference Oct. 15-17, 2013.

Tony Jiao, Charles Henville, Evolving Transmission Line Faults While Single Phase Open, 41st Annual Western Protective Relay Conference, Oct. 13-16, 2014.

Gabriel Benmouyal, Normann Fischer, Brian Smyth "Performance Comparison Between Mho Elements and Incremental Quantity-Based Distance Elements" Jan. 30, 2017.

Bogdan Kasztenny "Distance Elements for Line Protection Applications Near Unconventional Sources" Schweitzer Engineering Laboratories, Inc. Jun. 17, 2021.

PCT/US2025/043875 Patent Cooperation Treaty, International Search Report and Written Opinion of the International Searching Authority, Oct. 29, 2025.

* cited by examiner

250

252

YES        QUALIFYING
           LOAD
           ?                    NO 254                                      256

USE $Z_{21}$ AND $Z_{20}$        SET $Z_{21} = 0$
FROM MEMORY                      AND $Z_{20} = 0$

260

262

YES        PRE-FAULT
           CURRENT ABOVE
           THRESHOLD
           ?                    NO 264                                      266

DETERMINE $Z_{21}$          SET $Z_{21} = 0$
AND $Z_{20}$ BASED ON        AND $Z_{20} = 0$
PRE-FAULT DATA

MULTI-ENDED IMPEDANCE-BASED FAULT LOCATING FOR UNTRANSPOSED TRANSMISSION LINES

BACKGROUND

This disclosure relates to locating faults in electric power delivery systems. More particularly, this disclosure relates to determining a fault location in electric power delivery systems.

Transmission lines may be hundreds of miles long and/or cover remote terrain that may be difficult to navigate, which may make servicing faulted transmission lines difficult. Accurate fault location estimation is critical for improving power system reliability and is of great value to power system operators and transmission asset owners.

DETAILED DESCRIPTION

Figure 1:
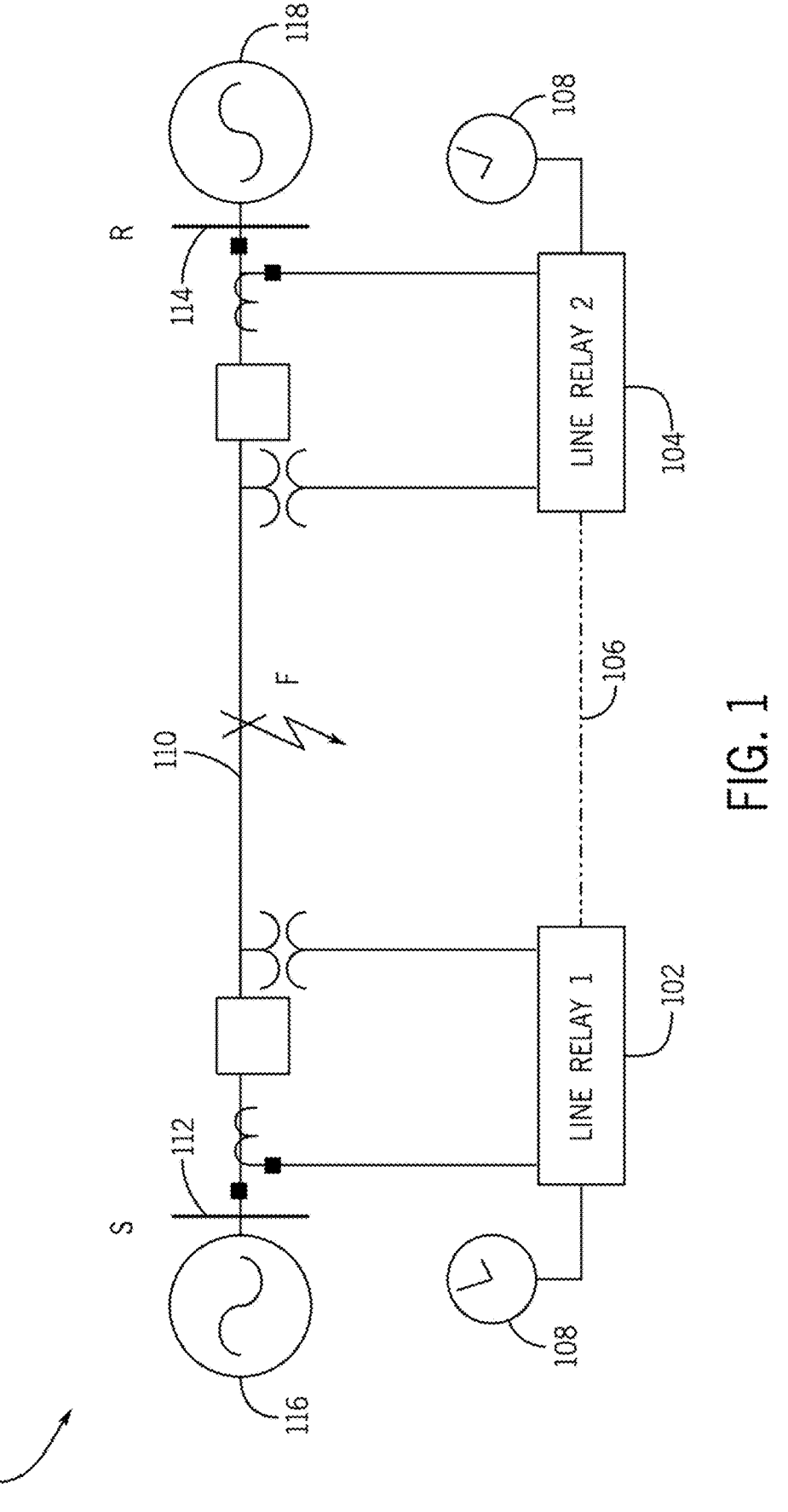
FIG. 1 is a block diagram of a system with a source terminal S and a remote terminal R, with a fault on a line between terminals S and R, in accordance with an embodiment.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Power delivery systems may use multiple transmission lines to transport large amounts of power. In some cases, the multiple transmission lines may be positioned in close proximity to one another and/or may share the same transmission towers in a multiple-circuit line arrangement. Various embodiments consistent with the present disclosure may analyze mutual coupling line parameters, which may characterize magnetic mutual induction in circuits of a multiple-circuit line or transmission lines within close proximity of each other. Various embodiments consistent with the present disclosure may also determine a location of a fault along the transmission line based on at least the mutual coupling line parameters between the transmission lines.

To analyze faults in three-phase power delivery system, the power system may be resolved into a positive-sequence network, a negative-sequence network, and a zero-sequence network. The positive-sequence network may have the same phase sequence as the original system, the negative-sequence network may have an opposite phase of the original system, and the zero-sequence network may include three phasors that are equal in phase and magnitude. A balanced three-phase power delivery system may include currents flowing through each phase that are equal in magnitude and have a 120-degree phase difference such that only positive-sequence current and voltage exist in the pre-fault network.

In an untransposed power delivery system, however, distribution of an electrical load may vary between phases and/or currents flowing through the phases may be unequal. Because negative-sequence values may be non-zero for untransposed transmission lines, such values may be of interest in determining a fault location along an untransposed transmission line. Further, it may be important to consider mutual induction effects of the positive-sequence network on the negative-sequence network ($Z_{21}$) and zero-sequence network on the negative-sequence network ($Z_{20}$) to accurately determine the fault location. Thus, various embodiments consistent with the present disclosure may estimate $Z_{20}$ and $Z_{21}$ mutual coupling parameters during pre-fault or normal load conditions to characterize (e.g., estimate) such mutual induction effects during a fault condition.

In certain embodiments, sensors may be used to monitor an electric power delivery system (e.g., electrical operating parameters). For instance, sensors (e.g., electrical sensors, temperature sensors, intelligent electronic devices (IEDs), and so forth) may be used and powered by a battery (e.g., rechargeable battery, either standing alone or connected to a power system, which may be charged when power is available), or by an additional power supply (e.g., power backup system, solar panel power system or other alternative power system, and so forth), or any combination of them (e.g., converting to other power supply methods when there is an outage on one power supply). The sensors may be coupled to an existing monitoring system, or may be standalone sensors. The sensors may be used to monitor the electric power delivery system for a period of time. In certain embodiments, the sensors may measure values of electrical operating parameters of a particular loop in a multiple-phase electric power delivery system and send the sensor data to an electrical monitoring system.

In certain embodiments, the electrical monitoring system may receive measurements of electrical operating parameters at a source terminal and a remote terminal on a particular loop before a fault occurred on the loop (pre-fault parameters), such that the fault occurred at a location between the source terminal and the remote terminal. The electrical monitoring system may then receive measurements of electrical operating parameters at the source terminal and the remote terminal of the particular loop after the fault occurred on the loop (post-fault parameters). With this in mind, the electrical monitoring system may determine $Z_{20}$ and $Z_{21}$ mutual coupling parameters based on the pre-fault parameters. The electrical monitoring system may then use the determined $Z_{20}$ and $Z_{21}$ mutual coupling parameters to determine the fault location of unbalanced faults between the source terminal and the remote terminal by using methods and techniques described in greater detail herein. The electrical monitoring system may send instructions to activate certain actions (e.g., protective actions) based on the determined fault location.

By way of introduction, FIG. 1 illustrates a block diagram of a system 100 for determining and calculating a location of a fault using sequence mutual coupling line parameters further described herein. System 100 may include generation, transmission, distribution and/or similar systems. System 100 illustrates a two-terminal line, and line relays, i.e., line relay 1 and line relay 2, are installed at each end. System 100 may be monitored by IEDs (and/or other suitable sensors, such as electrical sensors or temperature sensors, and so forth) 102 and 104 at the two relays of the system, although further IEDs may also be utilized to monitor further locations of the system. A data communication channel 106 may allow the IEDs 102 and 104 to exchange information relating to, among other things, voltages, currents, fault detections, fault locations, and the like. The IEDs 102 and 104 may also receive common time information from a common time source 108. System 100 includes a conductor 110, such as a transmission line (e.g., an untransposed transmission line) connecting two nodes, which are illustrated as a source terminal(S) 112 and a remote terminal (R) 114. A fault may occur on the transmission line at a location between the source terminal 112 and the remote terminal 114, which is indicated by F in FIG. 1. The source terminal 112 and the remote terminal 114 may be part of buses in a transmission system supplied by generators 116 and 118, respectively. Although illustrated in single line form for purposes of simplicity, system 100 may be a multi-phase system, such as a three-phase electric power delivery system.

As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. The IEDs 102 and 104 may obtain electric power system information using current transformers (CTs), potential transformers (PTs), Rogowski coils, voltage dividers and/or the like. The IEDs 102, 104 may be capable of using inputs from conventional instrument transformers such as CTs and PTs conventionally used in monitoring electric power delivery.

The common time source 108 may be any time source capable of delivering a common time signal to each of IEDs 102 and 104. Some examples of a common time source include a Global Navigational Satellite System (GNSS) such as the Global Positioning System (GPS) delivering a time signal corresponding with IRIG (Inter-Range Instrumentation Group), a network-based system such as corresponding with IEEE 1588 precision time protocol, and/or the like. According to one embodiment, the common time source 108 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

According to some embodiments, a time signal based on the common time source 108 may be distributed to and/or between IEDs 102 and 104 using data communication channel 106. Data communication channel 106 may be embodied in a variety of media and may utilize a variety of communication protocols. For example, the data communication channel 106 may be embodied utilizing physical media, such as coaxial cable, twisted pair, fiber optic, etc. Further, the data communication channel 106 may utilize communication protocols such as Ethernet, SONET, SDH, or the like, in order to communicate data.

In several embodiments, sequence mutual coupling line parameters may be used to determine and calculate the location of a fault. A faulted power delivery system may be resolved into a faulted positive-sequence network, a faulted negative-sequence network, and a faulted zero-sequence network. As mentioned, the faulted negative-sequence network may be used to determine the location of a fault in an untransposed power delivery system, but the faulted negative-sequence network may be impacted by mutual induction from the positive-sequence network and the zero-sequence network ($Z_{21}$ and $Z_{20}$, respectively). $Z_{21}$ and $Z_{20}$ may be determined by resolving the pre-fault network into a pre-fault negative-sequence network and a pre-fault zero-sequence network.

Figure 2:
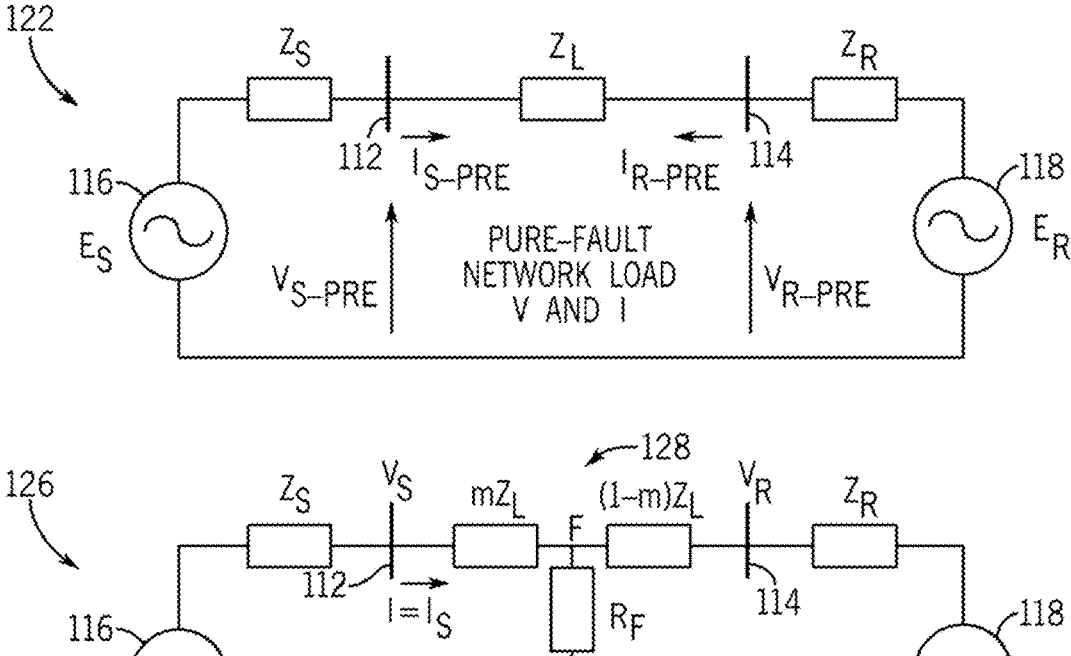
FIG. 2 illustrates the equivalent pre-fault and faulted circuit model for the system of FIG. 1.

FIG. 2 includes schematic diagrams of a pre-fault network 122, and a faulted network 126, with a fault 128 occurred at a location F between terminals 112 and 114. The source terminal 112 and the remote terminal 114 may include sensor units, such as IEDs 102 and 104, for detecting electrical properties (e.g., voltage and current) at the respective locations in the network. The pre-fault network 122 contains pre-fault sequence quantities, such as $V_{PRE}$ and $I_{PRE}$. The pre-fault network drives the load current through the network and establishes $V_F$ voltage at the fault location F. The pre-fault network provides the initial condition for the pure-fault Thevenin source, and $V_F$ is the voltage at location F before the fault 128 occurred. A source impedance ratio of the source terminal(S) 112 may be given by:

$$SIR - S = Z_S/Z_L, \qquad (1)$$

where $Z_s$ is the impedance of the source terminal(S) 112 and $Z_L$ is the line impedance. Additionally, a source impedance ratio of the remote terminal (R) 114 may be given by:

$$SIR - R = Z_R/Z_L, \qquad (2)$$

where $Z_R$ is the impedance of the remote terminal (R) 114.

The faulted network 126 contains faulted quantities, such as $V_S$, $I_S$, $V_R$ and $I_R$, that may be used with the pre-fault sequence quantities, such as $V_{S-PRE}$, $I_{S-PRE}$, $V_{R-PRE}$ and $I_{R-PRE}$, in the pre-fault network 122 to estimate accurate fault location. Relays (e.g., line relay 1 and line relay 2) at the terminals 112 and 114 measure both the pre-fault network 122 and the faulted network 126 signals directly. For example, the negative-sequence network sequence mutual coupling line parameters may be determined based on measurements acquired (e.g., by the IEDs 102 and 104) at the source terminal 112 and the remote terminal 114.

Figures 3A, 3B:
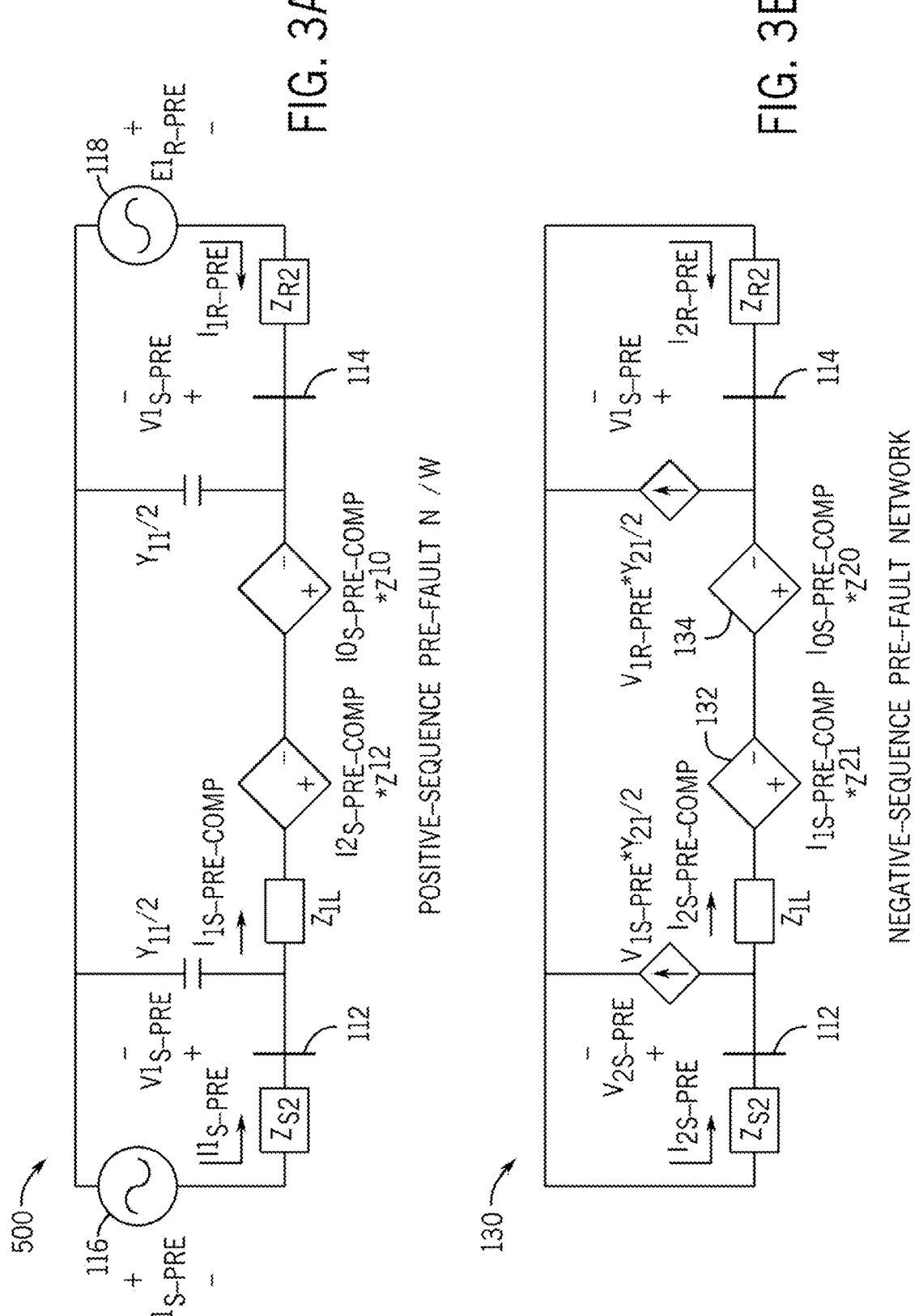
FIG. 3A is a block diagram of the pre-fault positive sequence network of the system of FIG. 1, in accordance with an embodiment.
FIG. 3B is a block diagram of the pre-fault negative sequence network of the system of FIG. 1, in accordance with an embodiment.

FIG. 3A illustrates a pre-fault positive-sequence network 500 of the system 100 that may be used to determine a charging current compensated positive-sequence current I1S-PRE-COMP. The pre-fault positive-sequence network 500 may be derived from or a part of the pre-fault network 122 of FIG. 2, for instance, and may include pre-fault positive-sequence quantities. As illustrated, the pre-fault positive-sequence network 500 includes pre-fault positive sequence quantities, such as $V_{1S-PRE}$ positive-sequence voltage of the source terminal 112, a $V_{1R-PRE}$ positive-sequence voltage of the remote terminal 114, a $I_{1S-PRE}$ positive-sequence current through a source impedance $Z_{S2}$ of the source terminal 112, an $I_{1R-PRE}$ positive-sequence current through a remote impedance $Z_{R2}$ of the remote terminal 114, and a positive-sequence transmission line impedance $Z_{1L}$.

$$I_{1S-PRE-Comp} = I_{1S-PRE} - V_{1S-PRE} * \frac{Y_{11}}{2} \tag{3}$$

where, $$Y_{11} = \frac{I_{1S-PRE} + I_{1R-PRE}}{\left(\frac{V_{1S-PRE} + V_{1R-PRE}}{2}\right)} \tag{4}$$

FIG. 3 illustrates a pre-fault negative-sequence network 130 of the system 100 that may be used to determine a positive-sequence mutual coupling on a negative-sequence network $Z_{21}$. The pre-fault negative-sequence network 130 may be derived from or a part of the pre-fault network 122 of FIG. 2, for instance, and may include pre-fault negative-sequence quantities. It should be noted, however, that the sequence mutual coupling line parameters may also be determined based on load-conditioned network. As illustrated, the pre-fault negative-sequence network 130 includes pre-fault negative sequence quantities, such a $V_{2S-PRE}$ negative-sequence voltage of the source terminal 112, a $V_{2R-PRE}$ negative-sequence voltage of the remote terminal 114, a $I_{2S-PRE}$ negative-sequence current through a source impedance $Z_{S2}$ of the source terminal 112, an $I_{2R-PRE}$ negative-sequence current through a remote impedance $Z_{R2}$ of the remote terminal 114, and a negative-sequence transmission line impedance $Z_{1L}$. The pre-fault negative-sequence network 130 may also include a first induction source 132 that may characterize a mutual coupling induction of the positive-sequence network on the pre-fault negative-sequence network 130 and may be determined by $$I_{1S-PRE-Comp} * Z_{21}, \tag{5}$$

where $I_{1S-PRE-COMP}$ is a pre-fault positive-sequence current leaving the source terminal 112 and $Z_{21}$ is a mutual coupling parameter of the positive-sequence network (including pre-fault positive-sequence quantities) on the negative-sequence network. As illustrated, pre-fault negative-sequence network 130 may also include a second induction source 134 that may characterize a mutual coupling induction of the zero-sequence network on the pre-fault negative-sequence network 130 and may be determined by $$I_{0S-PRE-COMP} * Z_{20}, \tag{6}$$

where $$I_{0S-PRE-COMP} = I_{0S-PRE} - V_{1S-PRE} * \frac{Y_{01}}{2}, \tag{7}$$

where, $$Y_{01} = \frac{I_{0S-PRE} + I_{0R-PRE}}{\left(\frac{V_{1S-PRE} + V_{1R-PRE}}{2}\right)} \tag{8}$$

where $I_{0S-PRE-COMP}$ is a pre-fault zero-sequence current leaving the source terminal 112 and $Z_{20}$ is a mutual coupling parameter of the zero-sequence network on the negative-sequence network.

A voltage difference between the $V_{2S-PRE}$ negative-sequence voltage of the source terminal 112 and the $V_{2R-PRE}$ negative-sequence voltage of the remote terminal 114 may thus be determined by $$V_{2S-PRE} - V_{2R-PRE} = \tag{9}$$

$$I_{2S-PRE-COMP} * Z_{1L} + I_{1S-PRE-COMP} * Z_{21} + I_{0S-PRE-COMP} * Z_{20},$$

where $$I_{2S-PRE-COMP} = I_{2S-PRE} - V_{1S-PRE} * \frac{Y_{21}}{2}, \tag{10}$$

and $$Y_{21} = \frac{I_{2S-PRE} + I_{2R-PRE}}{\left(\frac{V_{1S-PRE} + V_{1R-PRE}}{2}\right)} \tag{11}$$

By rearranging equation (9) and omitting the terms of the zero-sequence network (e.g., the second induction source 134), the mutual coupling parameter of the positive-sequence network on the negative-sequence network $Z_{21}$ may be determined by $$Z_{21} = \frac{(V_{2S-PRE} - V_{2R-PRE} - I_{2S-PRE-COMP} * Z_{1L})}{I_{1S-PRE-COMP}}. \tag{12}$$

Figure 4:
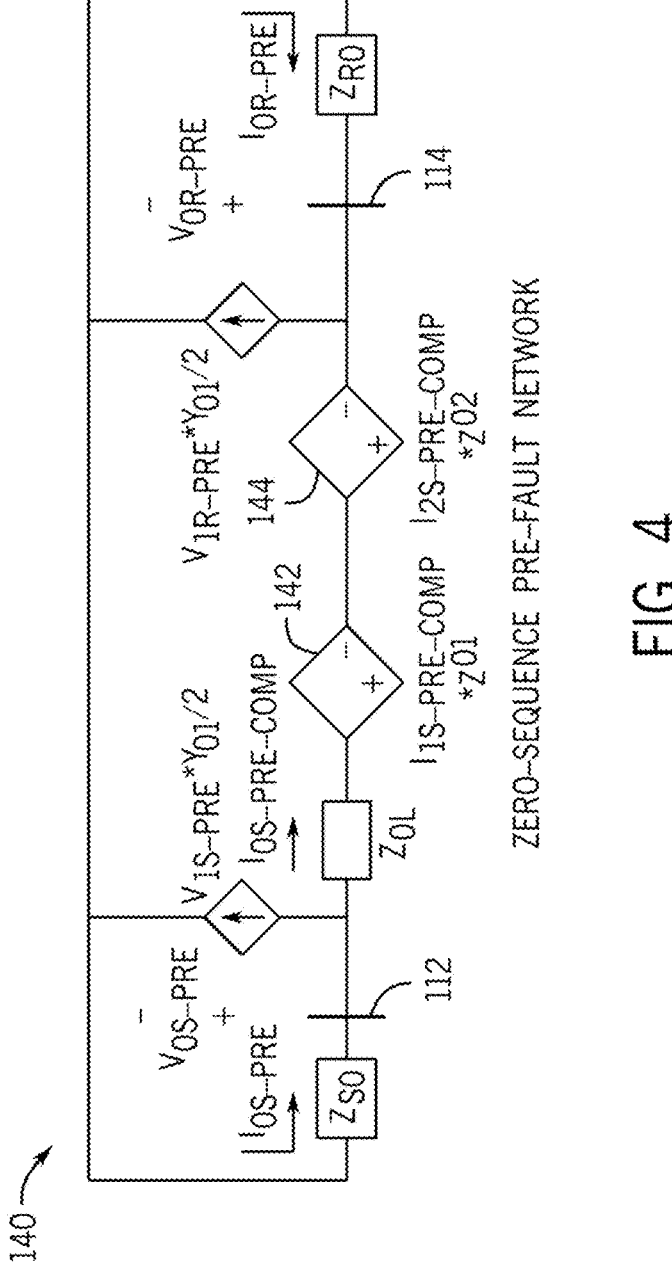
FIG. 4 is a block diagram of the pre-fault zero sequence network of the system of FIG. 1, in accordance with an embodiment.

Moving on, FIG. 4 illustrates a pre-fault zero-sequence network 140 of the system 100 that may be used to determine a zero-sequence mutual coupling on a negative-sequence network $Z_{20}$. In particular, $Z_{20}$ may be determined based on a positive-sequence mutual coupling on the zero-sequence network $Z_{01}$ of the pre-fault zero-sequence network 140. The pre-fault zero-sequence network 140 includes pre-fault zero-sequence quantities, such a $V_{0S-PRE}$ zero-sequence voltage of the source terminal 112, a VOR-PRE Zero-sequence voltage of the remote terminal 114, a $I_{0S-PRE}$ current through a source impedance $Z_{S0}$ of the source terminal 112, an $I_{0R-PRE}$ current through a remote impedance $Z_{R0}$ of the remote terminal 114, and a transmission line impedance ZOL. The pre-fault zero-sequence network 140 may also include a first induction source 142 that may characterize a mutual coupling induction of the positive-sequence network on the pre-fault zero-sequence network 140 and may be determined by $$I_{1S-PRE-COMP} * Z_{01}, \tag{13}$$

where $Z_{01}$ is a mutual coupling parameter of the positive-sequence network on the zero-sequence network. As illustrated, the system 100 may also include a second induction source 144 that may characterize a mutual coupling induction of the negative-sequence network on the pre-fault zero-sequence network 140 and may be determined by $$I_{2S-PRE-COMP} * Z_{02}, \tag{14}$$

where $Z_{02}$ is a mutual coupling parameter of the negative-sequence network on the zero-sequence network. A voltage difference between the zero-sequence source terminal voltage $V_{OS}$ and the zero-sequence remote terminal voltage $V_{OR}$ may thus be determined by $$V_{OS-PRE} - V_{OR-PRE} = \tag{15}$$

$$I_{0S-PRE-COMP} * Z_{0L} + I_{1S-PRE-COMP} * Z_{01} + I_{2S-PRE-COMP} * Z_{02}.$$

Additionally, based on a single-circuit Tx line sequence impedance matrix given by $$
\begin{matrix}
Z_{00} & Z_{01} & Z_{02} \\
Z_{10} = Z_{02} & Z_{11} & Z_{12} \\
Z_{20} = Z_{01} & Z_{21} & Z_{22} = Z_{11}
\end{matrix}
\quad , \tag{16}
$$

the mutual coupling parameter of the zero-sequence network on the negative-sequence network $Z_{20}$ is equal to the mutual coupling parameter of the positive-sequence network on the zero-sequence network $Z_{01}$. Thus, by rearranging equation (15) and omitting the terms of the negative-sequence network (e.g., the second induction source 144), the mutual coupling parameter of the zero-sequence network on the negative-sequence network $Z_{20}$ may be determined by $$Z_{20} = \frac{(V_{OS-PRE} - V_{OR-PRE} - I_{0S-PRE-COMP} * Z_{0L})}{I_{1S-PRE-COMP}}. \tag{17}$$

Figure 5:
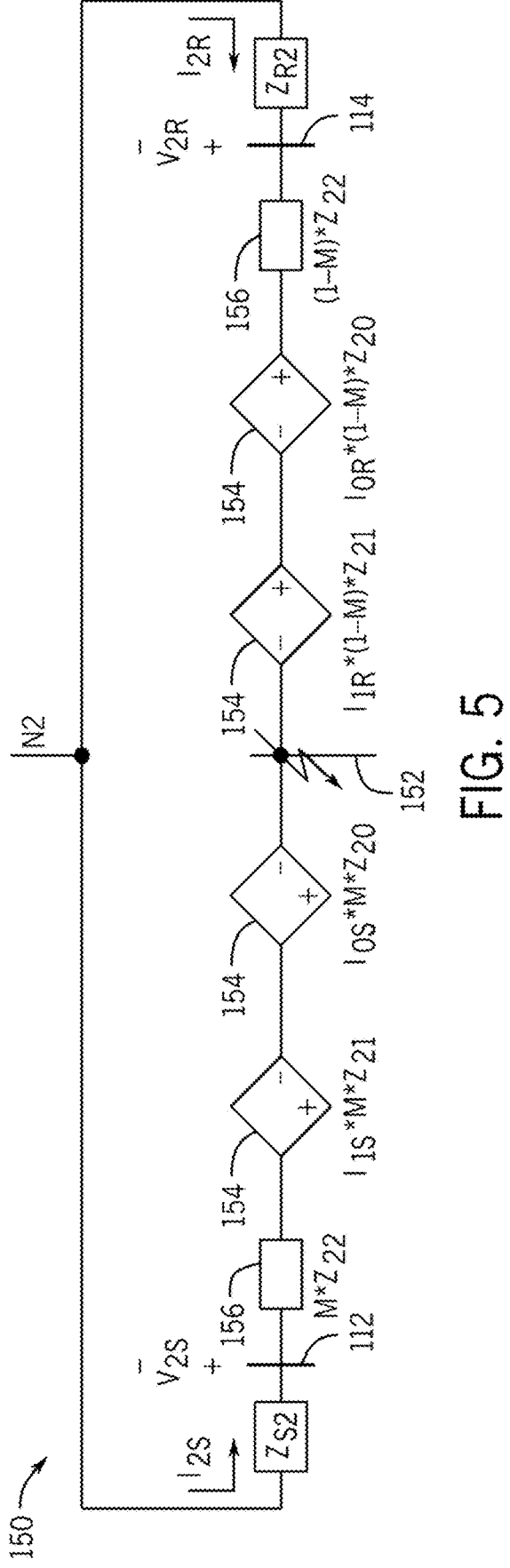
FIG. 5 is a block diagram of the faulted negative sequence network of the system of FIG. 1, in accordance with an embodiment.

With the foregoing in mind, FIG. 5 illustrates a negative-sequence faulted network 150 that may be used to determine a fault location 152. As may be appreciated, the negative-sequence faulted network 150 may include negative sequences of a network such as the faulted network 126. Additionally, the negative-sequence faulted network 150 includes mutual coupling terms 154 that may characterize mutual coupling effects of a positive-sequence network and a zero-sequence network on the negative-sequence faulted network 150. The negative-sequence faulted network 150 may also include negative-sequence line impedances 156 between the source terminal 112 and the remote terminal 114. Based on analysis of the illustrated network, a voltage difference between the voltage $V_{2S}$ of the source terminal

112 and the voltage $V_{2R}$ of the remote terminal 114 may be determined by $$V_{2S} - V_{2R} = m * Z_{20} * I_{0S} + m * Z_{21} * I_{1S} + m * Z_{22} * I_{2S} - \tag{18}$$

$$(1 - m) * Z_{20} * I_{0R} - (1 - m) * Z_{21} * I_{1R} - (1 - m) * Z_{22} * I_{2R},$$

where m is the per unit fault location from the source terminal 112. By manipulating equation (16), the fault location 152 may be found by $$m = \text{real}\left( \frac{V_{2S} - V_{2R} + Z_{22} * I_{2R} + Z_{21} * I_{1R} + Z_{20} * I_{0R}}{Z_{22} * (I_{2S} + I_{2R}) + Z_{21} * (I_{1S} + I_{1R}) + Z_{20} * (I_{0S} + I_{0R})} \right). \tag{19}$$

As may be appreciated, equations (12) and (17) may be used to determine sequence mutual coupling line parameters $Z_{21}$ and $Z_{20}$, respectively. As such, equations (12) and (17) may be useful for determining a fault location, particularly for situations in which $Z_{21}$ and $Z_{20}$ mutual coupling line parameters are not readily available (e.g., not provided by a terminal or input to the terminal by a user).

With the foregoing in mind, FIG. 6 is a flow chart of a method 200 for determining a fault location using sequence mutual coupling line parameters. Although the following description of the method 200 is described as being performed in a particular order, it should be noted that the method 200 may be performed in any suitable order. Moreover, it should be noted that the method 200 may be performed by any suitable computing system that may have certain processing capabilities. Further, the flow chart in FIG. 6 may be refined/enhanced based on system requirements.

For instance, the computing system may include a communication component, a processor, a memory, a storage, input/output (I/O) ports, a display, and the like. The communication component may facilitate communication between the computing system and the terminals 112 and 114 and any other suitable communication-enabled devices.

The processor may be any type of computer processor or microprocessor capable of executing computer-executable code. The processor may also include multiple processors that may perform the operations described below. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may store data, various other software applications for analyzing the data, and the like. The memory and the storage may represent non-transitory computer-readable media (e.g., any suitable form of memory or storage) that may store the processor-executable code used by the processor to perform various techniques described herein. It should be noted that non-transitory merely indicates that the media is tangible and not a signal.

The I/O ports may be interfaces that may couple to other peripheral components such as input devices (e.g., keyboard, mouse), sensors, input/output (I/O) modules, and the like. The display may operate to depict visualizations associated with software or executable code being processed by the processor. In an embodiment, the display may be a touch display capable of receiving inputs from a user. The display may be any suitable type of display, such as a liquid crystal display (LCD), plasma display, or an organic light emitting diode (OLED) display, for example.

Figure 6A:
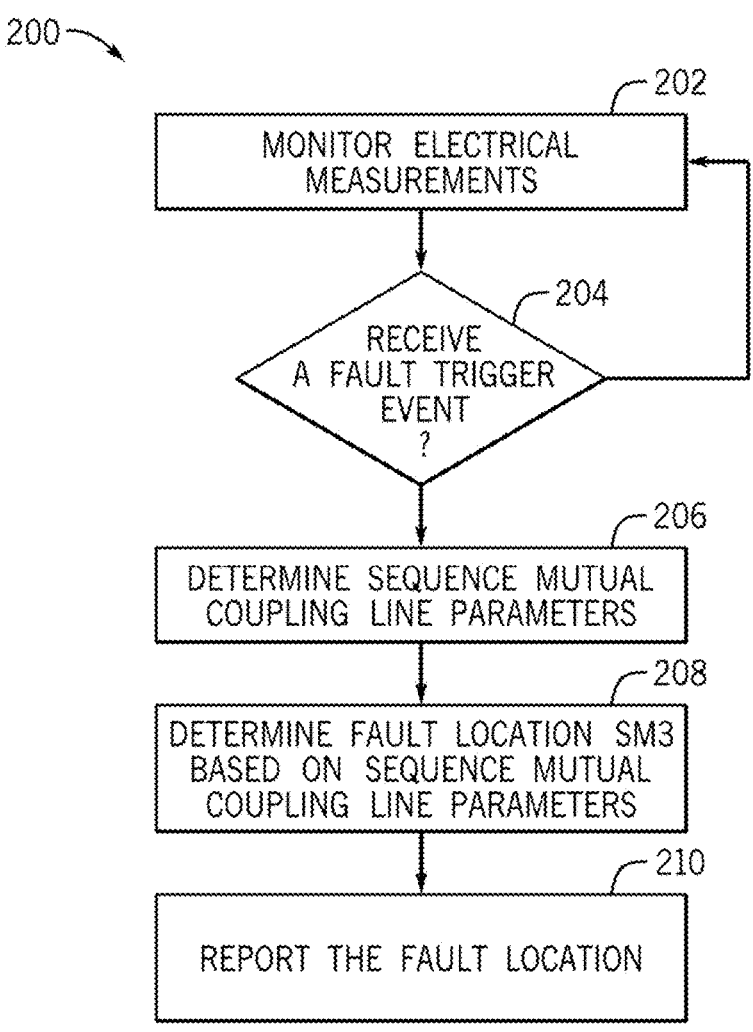
FIG. 6A is a flow chart of a method for determining the location of the fault of FIG. 1 using sequence mutual coupling line parameters, in accordance with an embodiment.

Referring now to FIG. 6A, at block 202, the computing system may continuously or periodically monitor the real-time and synchronized signals of electrical measurements for a power network at the source terminal 112 and the remote terminal 114. In some embodiments, the terminals 112 and 114 may include the IEDs 102 and 104, respectively, which may measure the electrical properties at the respective locations. The electrical measurements may include voltage measurements, current measurements, and the like in accordance to the equations described above. The IEDs 102 and 104 may then send data related to the electrical measurements to the computing system.

At block 204, the computing system may determine whether a fault is present based on receiving a notification of a fault trigger from any suitable device. The fault trigger may be identified based on values of the operating parameters of the system 100, such as the electrical operating parameters measured by electrical sensors monitoring the system 100, and/or the temperature of the operation environment of the system 100 measured by temperature sensors, etc. For example, when a fault occurs, values of one or more electrical operating parameters measured by the electrical sensors monitoring the system 100 may not be within corresponding predetermined ranges (e.g., an operating current larger than the predetermined allowable operating current range may indicate a short-circuit), which may be determined based on the properties and configurations of the system 100. In some embodiment, when a fault occurs, the temperature measurement of the operation environment measured by the temperature sensors monitoring the system 100 may get a value higher (or lower) than a threshold value, which may be predefined based on the operating parameters of the system 100. The fault trigger may be received from a device of the system 100 (e.g., a device connected directly with the computing system) or an external device outside of the system 100. In some embodiments, the fault trigger may be input to the computing system by a user.

The method 200 may continue, in block 206, with determining sequence mutual coupling line parameters. As described herein, this may include determining a $Z_{21}$ line parameter that characterizes a pre-fault positive-sequence mutual coupling effect on a pre-fault negative-sequence network based on the equation (12). Block 202 may also include determining a $Z_{20}$ line parameter that characterizes a pre-fault zero-sequence mutual coupling effect on a pre-fault negative-sequence network based on equation (17), as described herein.

At block 208, the computing system may determine the fault location based on sequence mutual coupling line parameters determined in block 206. The computing system may determine the fault location according to equation (19), as described above. After the fault and its location are determined, the computing system may, in block 210, send commands to related devices (e.g., contactors, relays, circuit breakers) to adjust operations based on the fault location at block. In addition, the fault location information may be used by dispatch crews for maintenance operations. For example, the operations might include a protective action, which may include opening or closing a circuit breaker, selectively isolating a portion of the electric power system via the breaker, etc. In various embodiments, the protective action may involve coordinating protective actions with other devices in communication with the system 100. In addition, the fault location computation can be used during post-processing actions to provide more visibility into the system like system parameters.

Figure 6B:
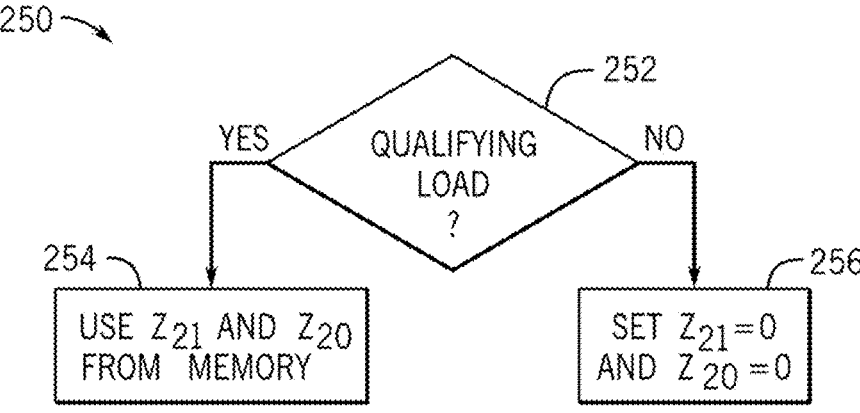
FIG. 6B is a flow chart of a first method for determining sequence mutual coupling line parameters that may be performed as part of or in conjunction with the method of FIG. 6, in accordance with an embodiment.

FIG. 6B is a flow chart of a first method 250 for determining sequence mutual coupling line parameters that may be performed as part of or in conjunction with the block 206 of FIG. 6A. In block 252, if a qualifying load is present, a $Z_{21}$ line parameter that characterizes a pre-fault positive-sequence mutual coupling effect on a pre-fault negative-sequence network and a $Z_{20}$ line parameter that characterizes a pre-fault zero-sequence mutual coupling effect on a pre-fault negative-sequence network may be retrieved from memory and used as the sequence mutual coupling line parameters in block 254. If, however, a qualifying load is not present, the $Z_{21}$ line parameter and the $Z_{20}$ line parameter may each be set to zero and used as the sequence mutual coupling line parameters in block 256.

Figure 6C:
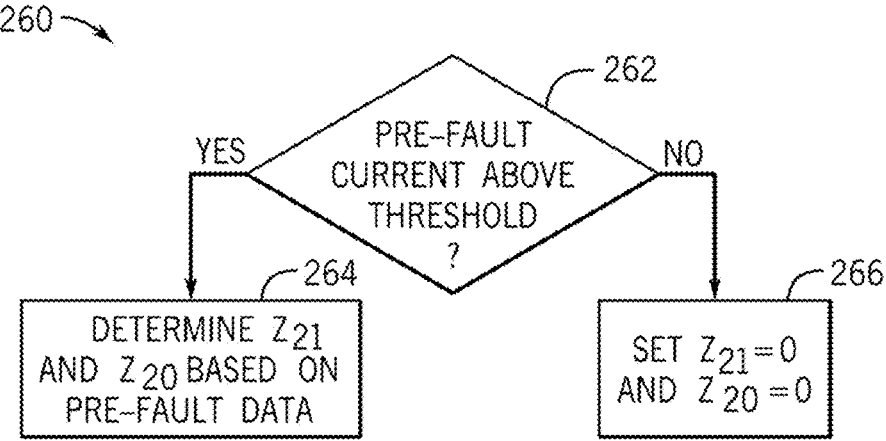
FIG. 6C is a flow chart of a second method for determining sequence mutual coupling line parameters that may be performed as part of or in conjunction with the method of FIG. 6, in accordance with an embodiment.

FIG. 6C is a flow chart of a second method 260 for determining the sequence mutual coupling line parameters. The second method 260 may be used in place of the method 250 and as part of or in conjunction with the block 206 of FIG. 6A. In block 262, a measured pre-fault current may be compared to a threshold (e.g., a rated current multiplied by a constant). If the measured pre-fault current is above the threshold, in block 264, the $Z_{21}$ line parameter and the $Z_{20}$ line parameter may be determined based on equation (12) and equation (17), respectively, and used as the sequence mutual coupling line parameters. If, however, the measured pre-fault current is below the threshold, in block 266, the $Z_{21}$ line parameter and the $Z_{20}$ line parameter may each be set to zero and used as the sequence mutual coupling line parameters.

Figure 7A:
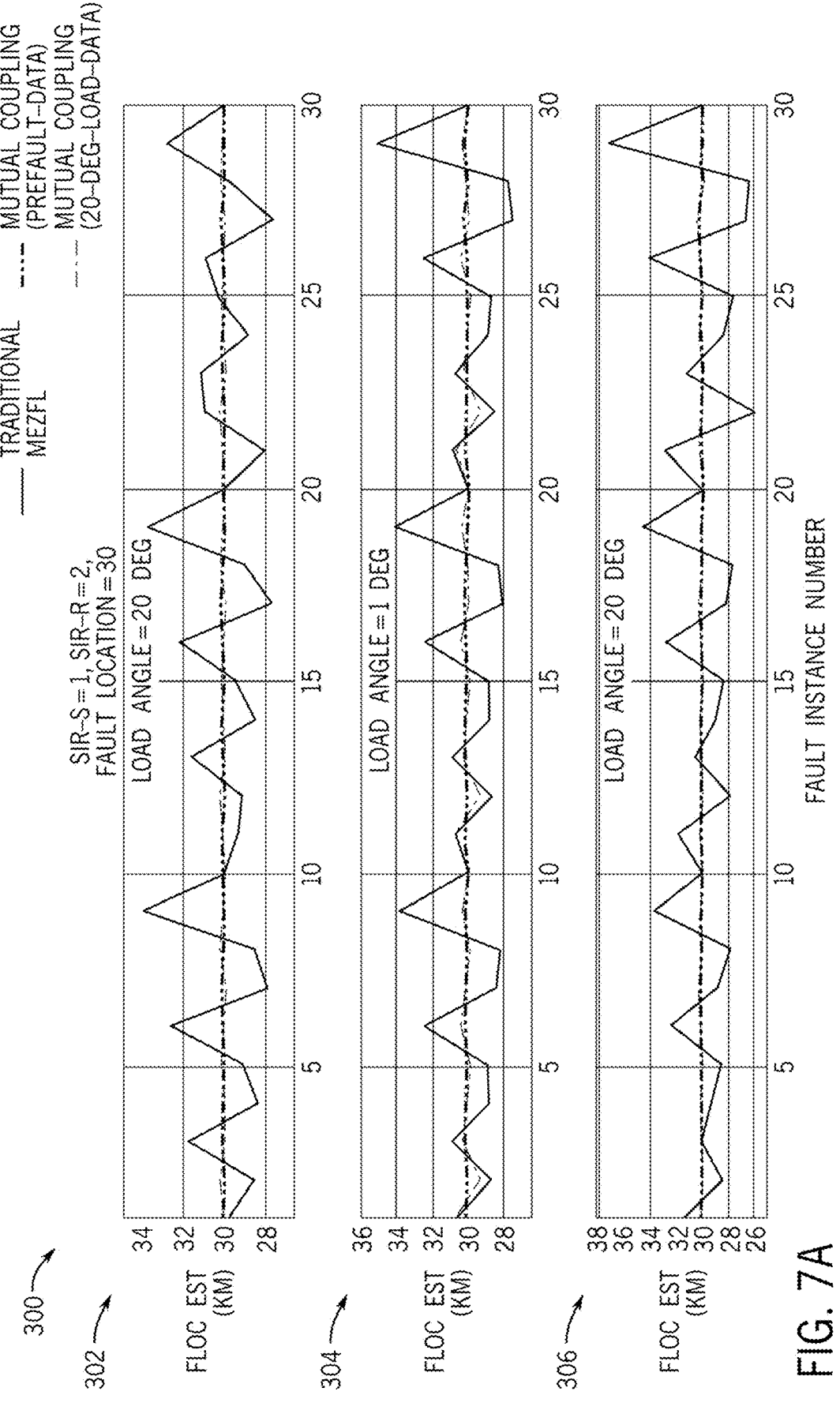
FIGS. 7A-7C illustrate comparisons of results of fault locations determined using different methods, in accordance with an embodiment.
Figure 7B:
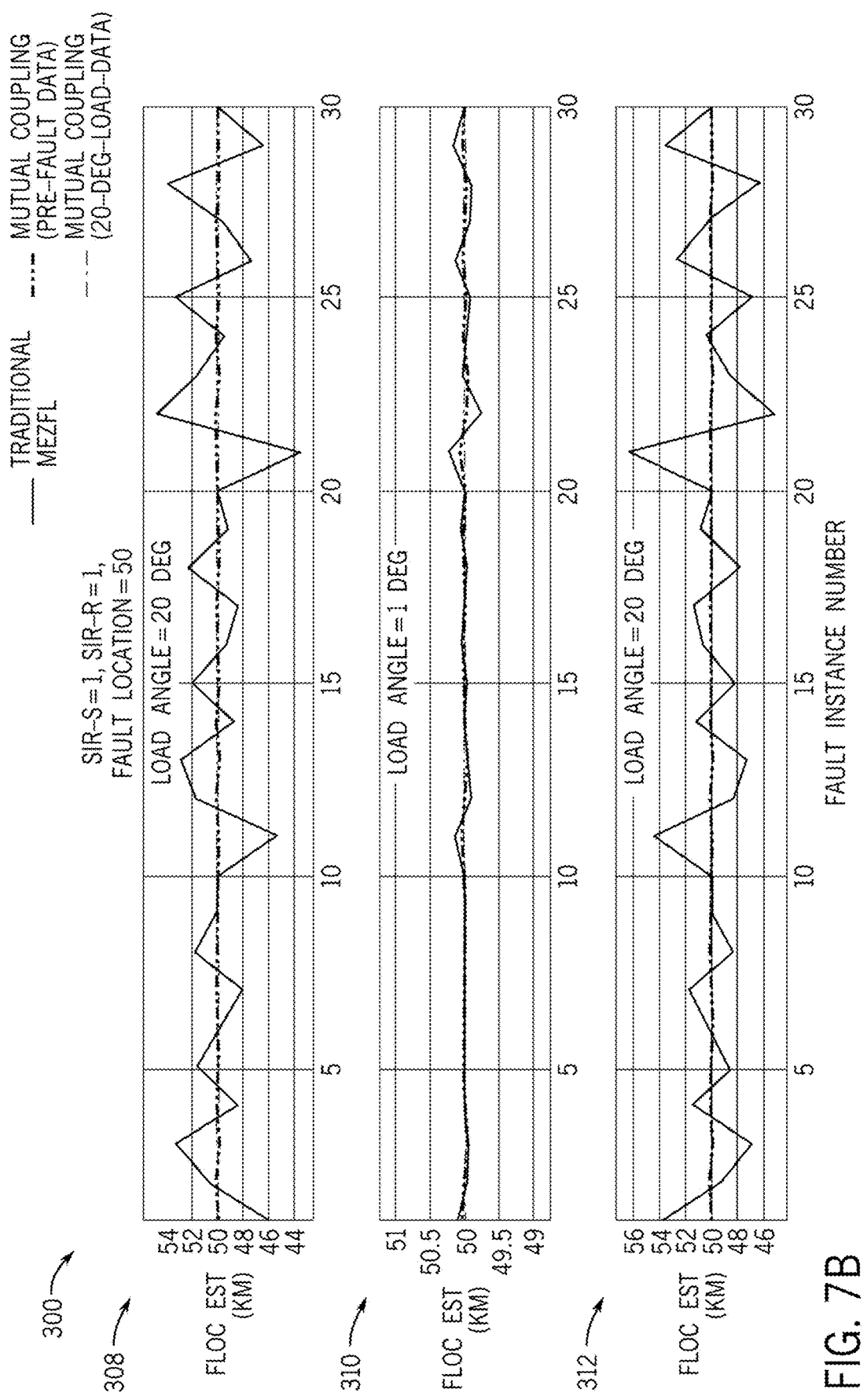

FIGS. 7A and 7B shows comparisons 300 of results of fault locations determined by using different methods for different power networks. Test results from simulations are provided. For all test cases, transmission lines (e.g., line length (LL)=100 km) are modeled as untransposed. Fault locations are calculated using Multi-ended impedance-based fault location method using faulted network quantities (MEZFL), the sequence mutual coupling line parameters method based on pre-fault data, and the sequence mutual coupling line parameters method based on qualifying load condition data, and results are illustrated with respect to the FLOC Error (km). For each fault location, faults are applied using the combination of load flow angle, fault resistance, and fault types described below (three phase electric power delivery system with phase A, phase B, and phase C):

Load Flow Angle: 20°, 1°, −20°
Fault Resistance: 0Ω, 10Ω, 40Ω
Fault Type: AG, BG, CG, AB, BC, CA, ABG, BCG, CAG, ABC In the above description, fault type AG indicates a fault on loop AG (i.e., phase A to ground), fault type BG indicates a fault on loop BG (i.e., phase B to ground), fault type CG indicates a fault on loop CG (i.e., phase C to ground), fault type AB indicates a fault on loop AB (i.e., phase B to phase A), fault type BC indicates a fault on loop BC (i.e., phase B to phase C), and fault type CA indicates a fault on loop CA (i.e., phase C to phase A). Fault types ABG, BCG, and CAG indicate double line-to-ground fault types. Fault type ABC indicates a triple-line fault type.

Diagram 302, 304, and 306 shows fault locations calculated using a 400 kV horizontal tower configuration with a source terminal SIR of 1 and a remote terminal SIR of 1. As used herein, SIR may be understood to mean a ratio of a source impedance to a line impedance for a terminal of a power delivery system. For example, for the source terminal 112 of FIG. 1, a source impedance may include an impedance of the generator 116, and a line impedance may include an impedance of the conductor 110. Test results for fault locations at 50 km are provided in diagram 302, 304, and 306. Test results for a load angle of negative 20 degrees are provided in diagram 302, test results for a load angle of 1 degree are provided in diagram 304, and test results for a load angle of 20 degrees are provided in diagram 306.

Diagram 308, 310, and 312 shows fault locations calculated using a 400 kV horizontal tower configuration with a source terminal SIR of 0.1 and a remote terminal SIR of 2. Test results for fault locations at 30 km are provided in diagram 308, 310, and 312. Test results for a load angle of negative 20 degrees are provided in diagram 308, test results for a load angle of 1 degree are provided in diagram 310, and test results for a load angle of 20 degrees are provided in diagram 312.

Figure 7C:
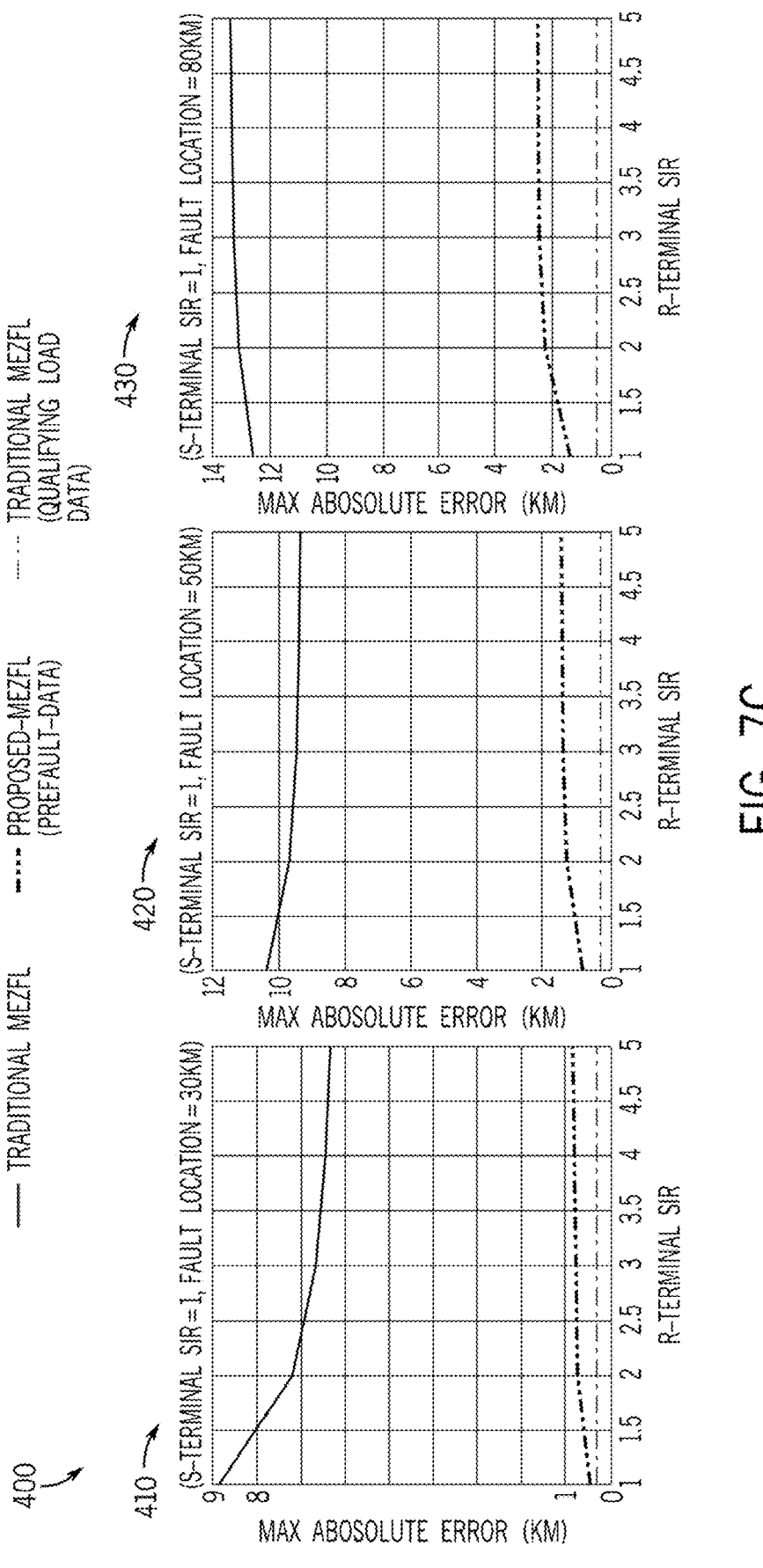

FIG. 7C shows comparisons 400 between test results of different methods for determining a fault location in a power network. In particular, the comparisons 400 includes worst-case fault location errors calculated using a 400 kV horizontal tower configuration with a source terminal SIR of 1 and a remote terminal SIR varying from 1 to 5 in increments of 0.5. In the illustrated comparisons 400, the worst-case error is the maximum absolute error out of 189 different faults, each resulting from one of seven different load angles (−20 deg, −10 deg, −5 deg, 1 deg, 5 deg, 10 deg, +20 deg), three different fault resistances, and nine different fault types (AG, BG, CG, AB, BC, CA, ABG, BCG, CAG). Test results for fault locations at 30 km are provided in plot 410, test results for fault locations at 50 km are provided in plot 420, and test results for fault locations at 80 km are provided in plot 430.

The results in FIG. 7 show that the disclosed method provides better fault location estimates for a power delivery system with untransposed lines. It should be noted that the fault location mentioned in the embodiments described above pertains to per unit fault location, but this output can be used to calculate the actual fault location in miles or kilometers if the total line length is mentioned. Thus, technical effects of the present disclosure include systems and methods for using sequence mutual coupling line parameters to determine fault location.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112 (f). For any claims containing elements designated in any other manner, however, it is intended that such elements are not to be interpreted under 35 U.S.C. 112 (f).

What is claimed is:

1. A method to determine a location of a fault in a power network, comprising:
monitoring, via one or more processors, electrical measurements associated with a loop within the power network from a set of sensors, wherein the electrical measurements comprise current measurements, voltage measurements, or both associated with the loop;
receiving, via the one or more processors, an indication of a presence of the fault;
determining, via the one or more processors, a first sequence mutual coupling parameter based on the electrical measurements, wherein the first sequence mutual coupling parameter indicates a mutual coupling of a positive sequence of the power network to a negative sequence of the power network;
determining, via the one or more processors, a second sequence mutual coupling parameter based on the electrical measurements, wherein the second sequence mutual coupling parameter indicates a mutual coupling of a zero sequence of the power network to the negative sequence of the power network;
determining, via the one or more processors, the location of the fault based on the indication of the presence of the fault, the first sequence mutual coupling parameter, and the second sequence mutual coupling parameter; and
sending one or more commands to one or more devices to adjust one or more operations based on the location of the fault.

2. The method of claim 1, wherein the one or more processors monitor the electrical measurements at two or more locations of the power network.

3. The method of claim 1, comprising:
determining, via the one or more processors, pre-fault sequence quantities based on the electrical measurements.

4. The method of claim 3, wherein the pre-fault sequence quantities comprise pre-fault positive-sequence quantities, pre-fault zero-sequence quantities, and pre-fault negative-sequence quantities.

5. The method of claim 4, wherein the first sequence mutual coupling parameter is determined based on the pre-fault positive-sequence quantities and the pre-fault negative-sequence quantities, and wherein the second sequence mutual coupling parameter is determined based on the pre-fault zero-sequence quantities and the pre-fault positive-sequence quantities.

6. The method of claim 1, wherein the indication of the presence of the fault is received from a device other than the one or more processors.

7. The method of claim 6, wherein the device comprises an intelligent electronic device.

8. The method of claim 1, wherein the indication of the presence of the fault is received from a user input.

9. The method of claim 1, wherein the loop within the power network comprises an untransposed transmission line.

10. The method of claim 1, wherein the set of sensors comprises an intelligent electronic device.

11. The method of claim 1, wherein the one or more devices comprises a circuit breaker, and wherein the one or more operations are associated with opening or closing the circuit breaker.

12. A system, comprising:

a set of sensors configured to acquire electrical measurements associated with a loop within a power network; and one or more processors configured to:

monitor the electrical measurements associated with the loop within the power network via the set of sensors, wherein the electrical measurements comprise current measurements, voltage measurements, or both associated with the loop;

receive an indication of a presence of a fault;

determine a first sequence mutual coupling parameter based on the electrical measurements, wherein the first sequence mutual coupling parameter indicates a mutual coupling of a positive sequence of the power network to a negative sequence of the power network;

determine a second sequence mutual coupling parameter based on the electrical measurements, wherein the second sequence mutual coupling parameter indicates a mutual coupling of a zero sequence of the power network to the negative sequence of the power network;

determine a location of the fault based on the indication of the presence of the fault, the first sequence mutual coupling parameter, and the second sequence mutual coupling parameter; and send one or more commands to one or more devices to adjust one or more operations based on the location of the fault.

13. The system of claim 12, wherein the one or more processors monitor the electrical measurements at two or more locations of the power network.

14. The system of claim 12, wherein the indication of the presence of the fault is received from a device other than the one or more processors.

15. The system of claim 12, wherein the loop within the power network comprises an untransposed transmission line.

16. The system of claim 12, wherein the one or more processors are configured to determine pre-fault sequence quantities based on the electrical measurements, wherein the pre-fault sequence quantities comprise pre-fault positive-sequence quantities, pre-fault zero-sequence quantities, and pre-fault negative-sequence quantities.

17. The system of claim 16, wherein the one or more processors are configured to determine the first sequence mutual coupling parameter based on the pre-fault positive-sequence quantities and the pre-fault negative-sequence quantities, and wherein the second sequence mutual coupling parameter is determined based on the pre-fault zero-sequence quantities and the pre-fault positive-sequence quantities.

18. A non-transitory computer-readable medium comprising computer-executable instructions that, when executed, are configured to cause at one or more processors to perform operations comprising:

monitoring electrical measurements associated with a loop within a power network from a set of sensors, wherein the electrical measurements comprise current measurements, voltage measurements, or both associated with the loop;

receiving an indication of a presence of a fault in the power network;

determining, via the one or more processors, a first sequence mutual coupling parameter based on the electrical measurements, wherein the first sequence mutual coupling parameter indicates a mutual coupling of a positive sequence of the power network to a negative sequence of the power network;

determining a second sequence mutual coupling parameter based on the electrical measurements, wherein the second sequence mutual coupling parameter indicates a mutual coupling of a zero sequence of the power network to the negative sequence of the power network;

determining a fault location based on the indication of the presence of the fault, the first sequence mutual coupling parameter, and the second sequence mutual coupling parameter, and sending one or more commands to one or more devices to adjust one or more operations based on the fault location.

19. The non-transitory computer-readable medium of claim 18, wherein the one or more processors monitor the electrical measurements at two or more locations of the power network.

20. The non-transitory computer-readable medium of claim 18, wherein the loop within the power network comprises an untransposed transmission line.

* * * * *